(12) United States Patent
Thinakaran et al.

(10) Patent No.: US 8,198,912 B1
(45) Date of Patent: Jun. 12, 2012

(54) DRIVER CIRCUIT CORRECTION ARM DECOUPLING RESISTANCE IN STEADY STATE MODE

(75) Inventors: Rajavelu Thinakaran, Bangalore (IN); Ashwin Ramachandran, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/979,336

(22) Filed: Dec. 28, 2010

(51) Int. Cl.
*H03K 17/16* (2006.01)

(52) U.S. Cl. .......................................... 326/30

(58) Field of Classification Search ............ 326/30
See application file for complete search history.

(56) References Cited

U.S. PATENT DOCUMENTS

| | | | |
|---|---|---|---|
| 6,791,356 B2 * | 9/2004 | Haycock et al. | 326/82 |
| 6,803,790 B2 * | 10/2004 | Haycock et al. | 326/82 |
| 7,348,794 B2 * | 3/2008 | Tanaka | 326/26 |
| 7,443,211 B2 * | 10/2008 | Liu | 327/108 |
| 7,501,851 B2 * | 3/2009 | Venditti et al. | 326/30 |
| 2007/0285120 A1 * | 12/2007 | Venditti et al. | 326/30 |

OTHER PUBLICATIONS

Marcel Kossel, Christian Menolfi, Jonas Weiss, Peter Buchmann, George Von Bueren, Lucio Rodoni, Thomas Morf, Thomas Toifl and Martin Schmatz, "A T-Coil-Enhanced 8.5 Gb/s High-Swing SST Transmitter in 65 nm Bulk CMOS With < -16 dB Return Loss Over 10 GHz Bandwidth", IEEE Journal of Solid-State Circuits, Vol. 43, No. 12, Year Dec. 2008, p. 2905-2920.

Edward Pillai and Jonas Weiss, "Novel T-Coil Structure and Implementation in a 6.4-Gb/s CMOS Receiver to Meet Return Loss Specifications", IBM Corporation, Copyright year 2007, IEEE, p. 147-153.

* cited by examiner

*Primary Examiner* — Shawki S Ismail
*Assistant Examiner* — Thienvu Tran
(74) *Attorney, Agent, or Firm* — Lawrence J. Bassuk; W. James Brady; Frederick J. Telecky, Jr.

(57) ABSTRACT

A voltage-mode driver circuit supporting pre-emphasis is implemented to include a driver arm and a correction arm. The driver arm receives an input signal, and is operable, in pre-emphasis intervals as well as steady-state intervals, to connect a first impedance between an output terminal of the driver circuit and a constant reference potential. The correction arm is operable to connect a correction impedance in parallel with the first impedance in pre-emphasis intervals, and to decouple the correction impedance from the first impedance in steady-state intervals. The parallel connection of the first impedance and the correction impedance in pre-emphasis intervals increases the voltage level of the output signal of the driver circuit in pre-emphasis intervals. The use of the correction arm compensates for the effect of parasitic capacitance at one or more nodes of the driver circuit, thereby reducing the settling time of the output signal and enabling high-speed operation.

4 Claims, 5 Drawing Sheets

| CURRENT INPUT BIT | PREVIOUS INPUT BIT | PMOS CONTROL SIGNAL | NMOS CONTROL SIGNAL |
|---|---|---|---|
| 0 | 0 | 1 | 0 |
| 0 | 1 | 0 | 0 |
| 1 | 0 | 1 | 1 |
| 1 | 1 | 1 | 0 |

DRIVER CIRCUIT CORRECTION ARM DECOUPLING RESISTANCE IN STEADY STATE MODE

BACKGROUND

1. Technical Field

Embodiments of the present disclosure relate generally to data transmission, and more specifically to a high speed voltage-mode driver supporting pre-emphasis.

2. Related Art

Driver circuits (drivers) are frequently used in data transmission. The inputs to such driver circuits are typically binary data, and the outputs are corresponding voltage or current signals of suitable signal strengths. The signal strengths of the output voltage or current may be designed to have values that ensure reliable and error free (or low error rate) transmission. In addition, driver circuits may be designed to have a controlled output impedance to match the impedance of a transmission path on which the outputs are transmitted. A voltage-mode driver is generally a driver circuit whose output is a voltage signal, the driver circuit being designed as a voltage source.

The output signals of such voltage-mode driver circuits, being typically of square wave shape (i.e., having sharp edges), contain high-frequency components, which may be attenuated by the transmission path, consequently resulting in errors in correct interpretation of the signal logic-levels at a receiver connected to receive the output signal. Pre-emphasis is a technique that is often used to address the problem noted above, and refers to increasing the amplitude of the output signal of a driver circuit immediately following a logic-level transition. The amplitude may subsequently be reduced to a desired steady-state level till another logic-level transition occurs. The increased amplitude (pre-emphasis, also termed feed-forward equalization or FFE) following logic-level transitions mitigates the adverse effect that a transmission path (which is typically band-limited) may have on the high frequency components of the output signal. Voltage-mode drivers with pre-emphasis may need to support high-speed operation, i.e., be capable of supporting high data-transmission rates, while also supporting operation at lower data-transmission rates.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

A driver circuit includes a driver arm and a correction arm. The driver arm is coupled to receive a digital signal representing an input signal of the driver circuit, and to connect a first impedance included in the driver arm between an output terminal of the driver circuit and one of a pair of constant reference potentials in each of a first mode of operation and a second mode of operation of the driver circuit. The correction arm includes a correction impedance, and is operable to connect the correction impedance in parallel with the first impedance in the first mode of operation and to decouple the correction impedance from the first impedance in the second mode of operation.

Several embodiments of the present disclosure are described below with reference to examples for illustration. It should be understood that numerous specific details, relationships, and methods are set forth to provide a full understanding of the embodiments. One skilled in the relevant art, however, will readily recognize that the techniques can be practiced without one or more of the specific details, or with other methods, etc.

BRIEF DESCRIPTION OF THE VIEWS OF DRAWINGS

Example embodiments will be described with reference to the accompanying drawings briefly described below.

The drawing in which an element first appears is indicated by the leftmost digit(s) in the corresponding reference number.

DETAILED DESCRIPTION

Various embodiments are described below with several examples for illustration.

1. Example Device

Figure 1:
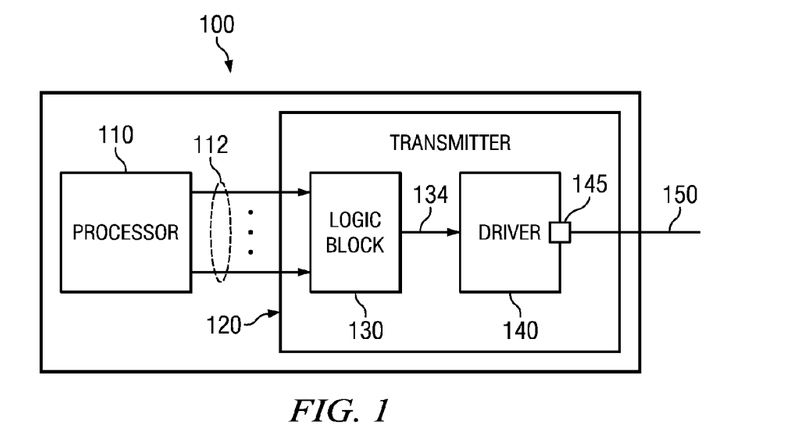
FIG. 1 is a block diagram illustrating the details of an example device in which several embodiments can be implemented.

FIG. 1 is a block diagram of an example device in which several embodiments of the present disclosure can be implemented. USB device 100 is shown containing processor 110 and transmitter 120. USB device 100 may correspond to a USB host, USB hub, USB peripheral, etc. In an embodiment, USB device 100 is implemented to conform to USB 3.0 specifications. The details of FIG. 1 are meant to be merely illustrative, and real-world implementations may contain more blocks/components and/or different arrangement of the blocks/components. Further, while the description below is provided in the context of a USB device, embodiments of the present disclosure can be deployed in other environments as well, such as, for example, e-SATA (External Serial Advanced Technology Attachment), PCI-E (Peripheral Components Interconnect Express), etc. Also, input paths to device 100 are not shown in the interest of conciseness, although such input paths may be present. USB device 100 may be implemented in integrated circuit (IC) form. Alternatively, the elements contained in USB device 100 may be implemented as separate ICs, for example processor 110 as one IC, and transmitter 120 as another IC.

Processor 110 provides data in parallel format to transmitter 120 on path 112. The data may be generated by processor 110 or represent data received from an external component (not shown) and modified by processor 110. The data on path 112 may be consistent with corresponding USB device specifications and formats.

Transmitter 120 is shown containing logic block 130 and driver 140. Logic block 130 receives data in parallel format on path 112 from processor 110, and converts the data into a serial bit stream. The parallel-to-serial conversion in logic block 130 may be performed under control of one or more clocks, as is well-known in the relevant arts. Corresponding to each bit in the bit stream, logic block 130 generates (multiple) control signals on path 134 to enable driver 140 to generate and transmit a signal representing the bit. Although not shown in FIG. 1, a pre-driver circuit contained in logic block 130 may generate such control signals.

Although not shown, USB device 100 may also contain a receiver designed to receive data in serial format from a component or device external to device 100, and to provide the data to processor 110 in parallel format. In such an embodiment, the receiver together with transmitter 120 constitutes a serializer/de-serializer (SERDES). USB device 100 may contain several of such SERDES blocks, although only the transmitter of one of such blocks is shown in FIG. 1.

Terminal 145 represents an output terminal of driver 140, and may correspond to a pad or pin of USB device 100, when implemented as an IC. Path 150 is connected to terminal 145, and may correspond, for example, to a printed circuit board (PCB) trace, flexible cable, etc.

Voltage-mode driver 140 generates, on terminal 145 and path 150, voltage outputs representing logic high and logic low signals (i.e., binary signals) received by transmitter 120 on path 112. The binary signals are generated in response to corresponding values of control signals received on path 134. Path 150 may represent a transmission line, and have a finite bandwidth. The binary signals transmitted on path 150 (ideally) have a square wave (or near-square wave) shape, and therefore have sharp rise and fall edges. The frequency content of the binary signals may, therefore, exceed the bandwidth of path 150. As a result, and as is well-known in the relevant arts, the binary signals may be spread in time, thereby potentially resulting in inter-symbol interference (ISI) in receivers connected to path 150. Hence, the receivers may not be able to reliably interpret the values (logic one/high or logic zero/low) of the signals transmitted on path 150.

The extent of ISI, and therefore degradation in reliably interpreting the received values, may vary depending on the specific type of data encoding used. For example, according to Manchester encoding, sharp transitions (bit edges) in the bit stream on path 150 occur at every bit interval. In NRZ (Non Return to Zero) coding, such sharp transitions may occur only when there is a change in the value of bits from a logic one to logic zero or vice versa.

According to one technique used to address the problem noted above, signal strength (e.g., voltage levels) of the bit stream on path 150 are increased (pre-emphasized) at every bit edge of concern. Bit edges of concern generally depend on the specific encoding scheme used. Assuming bipolar NRZ (Bipolar Non Return to Zero) is used, a bit stream with pre-emphasis applied at logic value boundaries is shown in FIG. 2.

Figure 2:
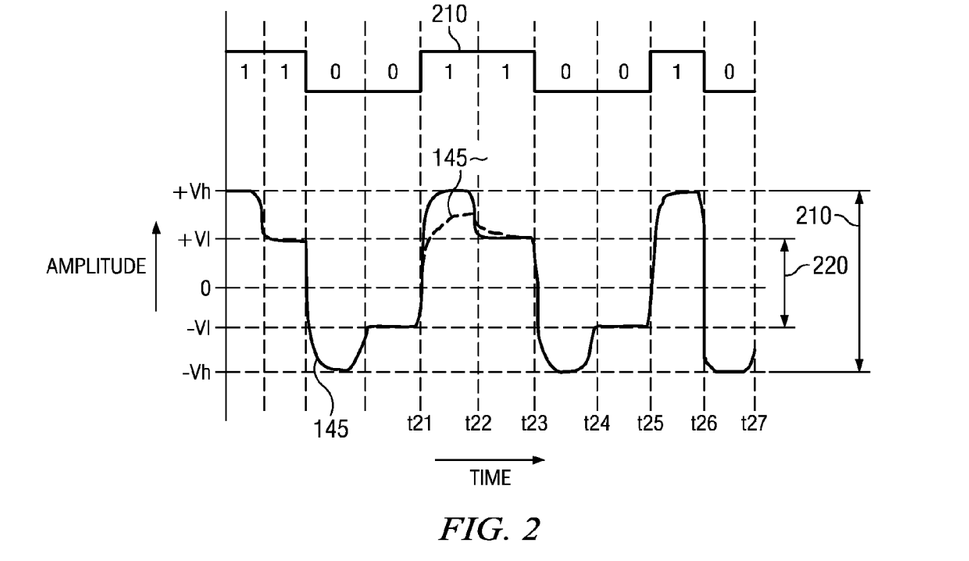
FIG. 2 is a waveform illustrating output voltage levels in pre-emphasis and steady-state intervals of a driver in an embodiment.

Waveform 210 of FIG. 2 represents a signal internal to logic block 130, and represents the binary sequence 1100110010. In operation, logic block 130 may obtain the sequence 210 by conversion of a corresponding set of data values received in parallel form via path 112. Logic block 130 generates control signals representing the sequence 120 to cause driver 140 to generate output signal 145 (waveform 145 of FIG. 2) with pre-emphasis added. Either the sequence 210 or the corresponding control signals representing sequence 210 (and generated by logic block 130) may be viewed as an 'input signal' to driver 140.

Voltage levels of logic one and logic zero of waveform 145 are shown pre-emphasized for one bit-duration following a transition between a logic zero and logic one. To illustrate, at t21, a transition from logic zero to logic one occurs. Hence, the voltage value representing the following logic one is pre-emphasized, and has a voltage level (ideally) equal to +Vh for the duration t21-t22, i.e., one bit period. Interval t21-t22 represents a "pre-emphasis interval".

Interval t22-t23 represents a "steady-state" interval where there is no change in the logic value of the bit stream. At t22, the voltage level used to represent signal 150 changes from the high voltage level +Vh (used to represent pre-emphasized logic one durations) to a steady-state voltage level +Vl. The voltage level representing signal 150 is maintained at +Vl till a logic level transition occurs, as shown in FIG. 2 at t23, when signal 150 transitions from a logic one to a logic zero.

Similarly, voltage levels of signal 150, immediately following logic one to logic zero transitions are shown pre-emphasized. To illustrate, at t23, a transition from a logic one to a logic zero occurs. Hence, the voltage value representing the following logic zero is pre-emphasized, and has a voltage level (ideally) equal to −Vh for the duration t23-t24. Interval t24-t25 represents a steady-state condition where there is no change in the logic value of the bit stream. The voltage level representing signal 150 is maintained at −Vl till a logic level transition occurs, as shown in FIG. 2, at t25. At t25, a logic transition to logic one occurs and the voltage value corresponding to the logic one bit in interval t25-t26 is pre-emphasized. At t26, a logic transition to logic zero occurs and the voltage value corresponding to the logic zero bit in interval t26-t27 is also pre-emphasized.

Operation of driver 140 in pre-emphasis intervals may be referred to as operation in a pre-emphasis mode (first mode). Operation of driver 140 in steady-state intervals may be referred to as operation in a steady-state mode (second mode).

It is noted that, alternatively, the steady-state levels (+Vl and −Vl) may instead be viewed as a de-emphasized level, and the pre-emphasized levels (+Vh and −Vh) may instead be viewed as the 'normal' level.

In an embodiment, a 'pre-emphasis interval' is an interval of one bit period immediately following a logic transition of the input signal represented by signals on path 134. However, in other embodiments, the duration of the pre-emphasis interval may be shorter (e.g., half-bit) or longer than one bit period. When there is no logic-level transition of the input signal for at least a two-bit duration, a 'steady-state interval' exists, and is an interval from the start of the second bit in the two-bit duration and ending at a next logic-level transition of the input signal.

2. Driver

Figure 3:
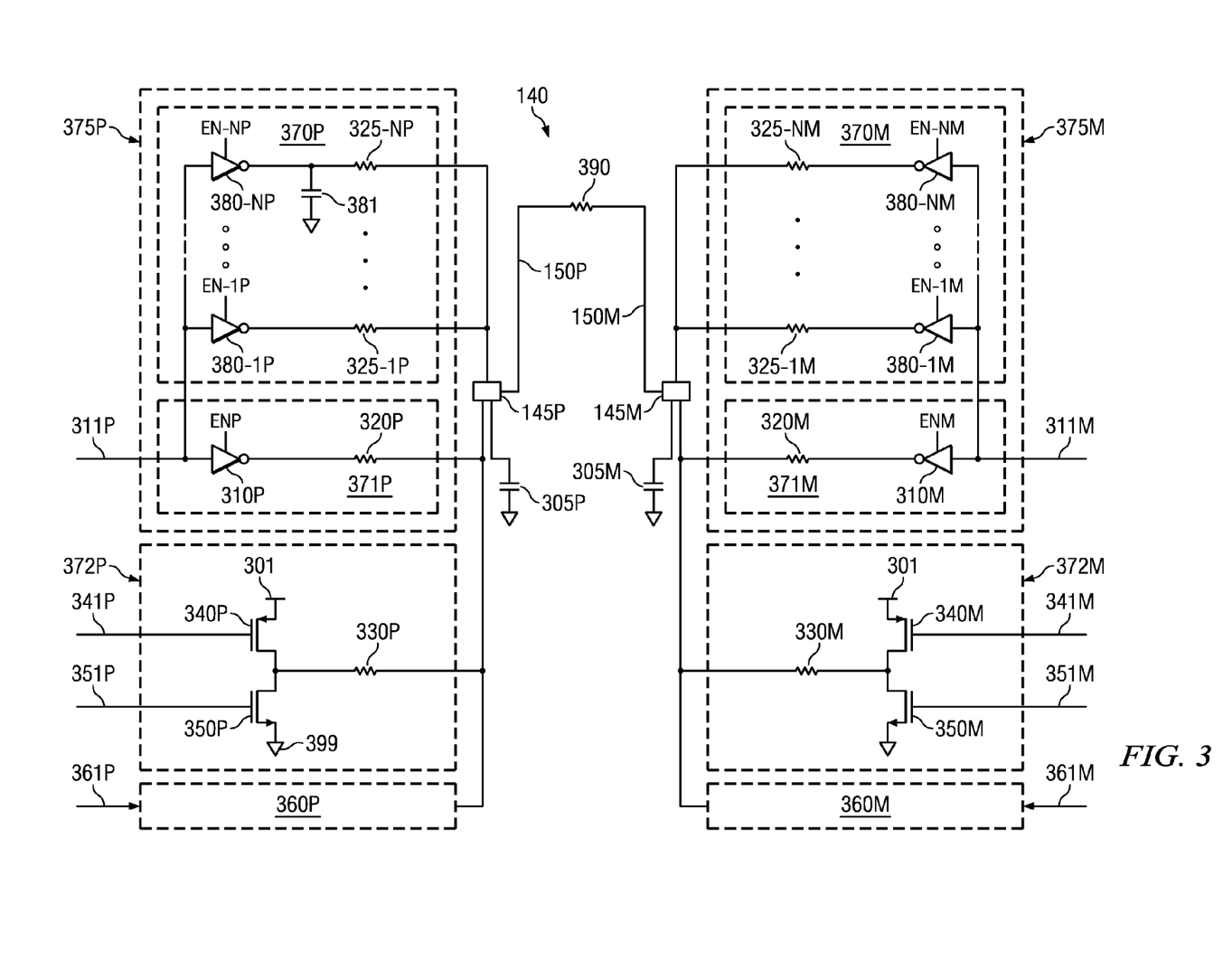
FIG. 3 is a circuit diagram illustrating the implementation details of a driver in an embodiment.

FIG. 3 is a diagram illustrating the implementation details of driver 140 in an embodiment. Driver 140 is shown containing driver arms 371P and 371M, trim blocks 370P and 370M, pre-emphasis correction arms 372P and 372M, and blocks 360P and 360M. The output of driver 140 is provided as a differential voltage across terminals 145P and 145M. Terminals 145P (output terminal) and 145M (which may be viewed as a second output terminal) correspond to terminal 145 of FIG. 1. Resistor 390 represents a terminating impedance external to driver 140, and is used to minimize reflections when data are transmitted on transmission line 150P/150M, which corresponds to path 150 of FIG. 1.

Driver arm 371P (first driver arm) is shown containing CMOS inverter 310P and resistor 320P (first impedance). Driver arm 371M (second driver arm) is shown containing CMOS inverter 310M and resistor 320M (second impedance). Driver arms 371P and 371M receive respective inputs on paths 311P and 311M. When the input on path 311P (digital signal) is a logic high, the input on path 311M (logic inverse of the digital signal) is a logic low, and vice versa.

Trim block 370P is shown containing CMOS inverters 380-1P through 380-NP, and resistors 325-1P through 325-NP. Trim block 370P is used to correct for (i.e., trim) a difference in the resistance value of resistor 320P of driver arm 371P from a desired value due to process, voltage and/or temperature (i.e., PVT) variations. The specific number 'N' of 'trim arms (combination of a CMOS inverter and a resistor, such as 380-1P and 325-1P) may be determined by a desired degree of correction by trimming, and an expected range of variations of resistance 320P. Each of the N trim arms of trim block 370P receives the same input 311P as driver arm 371P.

Trim block 370M is shown containing CMOS inverters 380-1M through 380-NM, and resistors 325-1M through 325-NM. Trim block 370M is used to correct for a difference in the resistance value of resistor 320-1M of driver arm 371P from a desired value due to PVT variations. The specific number 'N' of 'trim arms in trim block 370M equals the number of trim arms implemented for trim block 370P. Blocks 371P and 370P are collectively referred to as block 375P. Blocks 371M and 370M are collectively referred to as block 375M. Each of the N trim arms of trim block 370M receives the same input 311P as driver arm 371M.

Signals EN-1P through EN-NP, and EN-1M through EN-NM represent respective enable signals provided to inverters 380-1P through 380-NP and 380-1M through 380-NM. When enabled to be operative, each trim arm adds a resistor in parallel with the respective ones of resistors 320P and 320M. For example, if EN-1P has a value that enabled operation of inverter 380-1P, resistor 325-1P is connected in parallel with resistor 320P. Typically, the value of the resistor (e.g., resistor 320P) in a driver arm is implemented to be larger than a desired value since correction/trimming by use of the trim arms can only add a resistance in parallel with the value of the resistor in the driver arm, and therefore can operate only to lower the combined resistance. Inverters 310P and 310M may also receive enable/disable signals on respective paths ENP and ENM. Enable signals EN-1P through EN-NP, EN-1M through EN-NM, ENP and ENM may be generated on path 134 by logic block 130.

Blocks 360P and 360M may respectively be implemented identical to blocks 375P and 375M, except that the resistors used in blocks 360P and 360M may have resistance values different from the resistances in blocks 375P and 375M. In operation, corresponding resistors in blocks 360P and 360M are connected either in parallel with resistor 320P and 320M, or to a power supply or ground terminal, as illustrated below with respect to FIGS. 4A and 4B.

Each of blocks 372P and 372M represents a pre-emphasis correction arm to enable fast settling times of the output across terminals 145P/145M in pre-emphasis intervals, as described below.

Figure 4A:
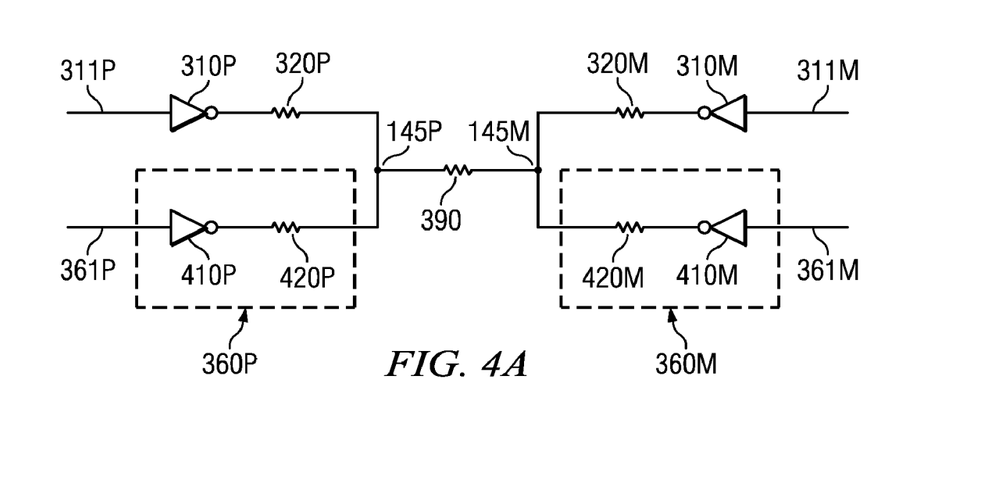
FIG. 4A is a diagram used to illustrate the operation of an embodiment of a driver.
Figure 4B:
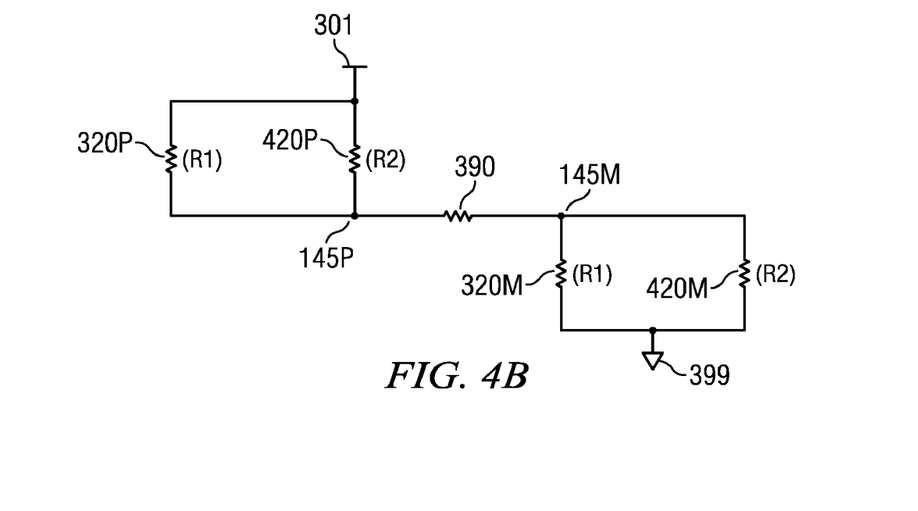
FIG. 4B is an equivalent circuit diagram of a driver when a pre-emphasized logic one is generated by the driver, in an embodiment.
Figure 4C:
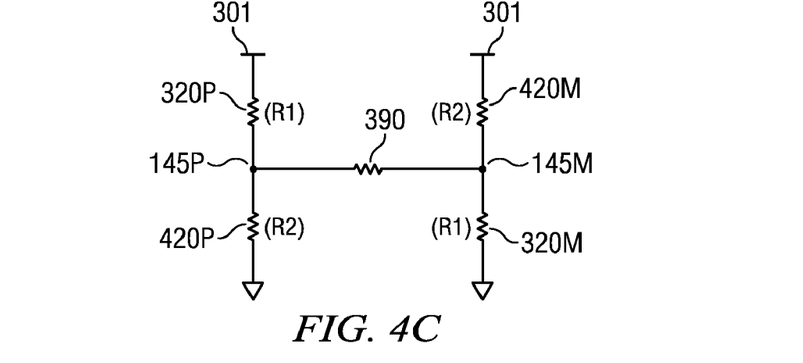
FIG. 4C is an equivalent circuit diagram of a driver when a logic one is generated by the driver in steady-state, in an embodiment.

FIGS. 4A, 4B and 4C are diagrams used to illustrate the operation of driver 140. Referring to FIG. 4A, CMOS inverter 410P and resistor 420P are contained in the driver arm of block 360P. CMOS inverter 410M and resistor 420M are contained in the driver arm of block 360M. Trim arms of blocks 375P, 375M, 360P and 360M are not shown for ease of description. In FIG. 4A, the connections and operation of blocks 372P and 372M are ignored for illustrative purposes. Resistances of resistors 320P and 320M have the same value R1. Resistances of resistors 420P and 420M have the same value R2. The values R1 and R2 may be selected to obtain desired voltage levels across terminals 145P/145M in pre-emphasized and steady-state intervals.

When a pre-emphasized logic one is to be generated across terminals 145P/145M, signals 311P and 361P are each a logic zero, 311M and 361M are each a logic one, and the circuit of FIG. 4A reduces to the equivalent circuit shown in FIG. 4B. Assuming, for example, that R1 equals 60 ohms, R2 equals 300 ohms, and power supply voltage 301 equals 1 volt (1V), the voltage at terminal 145P equals 0.75V, the voltage at terminal 145M equals 0.25V, and the differential output voltage across 145P/145M equals 0.5V. When a pre-emphasized logic zero is to be generated across terminals 145P/145M, signals 311P and 361P are each a logic one, and signals 311M and 361M are each a logic zero, thereby generating an output voltage of −0.5V across 145P/145M. In the example, logic one to logic zero voltage swing on output 145P/145M in the pre-emphasis mode equals 1V.

When a logic one in the steady-state is to be generated across terminals 145P/145M, signals 311P and 361M are each a logic zero, 311M and 361P are each a logic one, and the circuit of FIG. 4A reduces to the equivalent circuit shown in FIG. 4C. For values of R1, R2 and power supply voltage 310 as assumed above, the voltage at terminal 145P equals 0.67V, the voltage at terminal 145M equals 0.33V, and the differential output voltage across 145P/145M equals 0.34V. When a logic zero in the steady-state is to be generated across terminals 145P/145M, signals 311P and 361M are each a logic one, 311M and 361P are each a logic zero, thereby generating an output voltage of −0.34V across 145P/145M. In the example, logic one to logic zero voltage swing on output 145P/145M in the steady-state mode equals 0.68, and a pre-emphasis-to-steady-state output voltage ratio (or pre-emphasis level) of 3.5 dB is obtained. For other pre-emphasis ratios (or pre-emphasis levels), values of R1 and R2 are selected accordingly, with the constraint that the output impedance (also termed looking-in impedance) of driver 140 has a desired value (e.g., 50 ohms). In the above example, the output impedance of driver 140 equals fifty ohms. In general, however, the specific value of output impedance to be provided may be determined based on the characteristic impedance of transmission line 150. Signals 361P and 361M may be generated by logic block 130 to achieve a desired level of pre-emphasis.

In an embodiment, driver 140 is implemented to selectably provide a desired one of multiple pre-emphasis levels and/or selectable output voltage levels across 145P/145M. In such an embodiment, driver 140 contains additional blocks similar to 375P, 360P, 375M and 360M of FIG. 2. The additional blocks are implemented with resistors with resistance values that enable provision of a desired pre-emphasis level and/or output voltage level. For example, if a pre-emphasis of 6 dB is to be provided for output 145P/145M, driver 140 may be implemented with four additional blocks similar to blocks 375P, 360P, 375M and 360M, but with a 100 ohm resistor in each of the four blocks. The additional blocks may be operated (instead of blocks 375P, 360P, 375M and 360M, but in a similar manner to that described above) to provide the desired 6 dB pre-emphasis level. Although, not shown in FIG. 3, each of such constituent blocks of driver 140 may be selectively enabled or disabled via corresponding select signals.

Referring to FIG. 3, one or more of the trim arms of each of blocks 370P and 370M may be enabled to be operative. Such enabling is typically performed based on tests conducted at a post-fabrication testing stage of ICs containing driver 140. The enabling may be performed by permanently setting the corresponding enable signals to a corresponding voltage or logic level. Alternatively, the respective enable signals may be generated "on the fly" by logic block 130 on path 134. The trim arms of blocks 370P and 370M are used to correct for resistance variations (due to PVT) in the resistances of driver arms 371P and 371M respectively. Thus, for example, assuming that resistance 320P is implemented to (ideally) have a value of seventy five ohms, but actually has a value of ninety ohms, one or more of trim arms of block 370P may be enabled to connect the corresponding resistances (one or more of resistances 325-1P through 325-NP) in parallel with resistor 320P to bring down the effective resistance of the parallel combination to fifty ohms. Trim arms of trim block 370M (as well as those of any additional blocks in driver 140) may be operated similarly.

Capacitor 305P represents the parasitic capacitance between output terminal 145P and ground. Capacitor 305M represents the parasitic capacitance between output terminal 145M and ground. Capacitances 305P and 305M include the capacitance due to package leads and bond wire connected to the respective terminals 145P and 145M. Further, resistors in each of the blocks of FIG. 3 contribute to the total parasitic capacitance (305P and 305M) at the output terminals, irrespective of whether the corresponding trim arms are enabled to be operative or not. In general, larger the number of the components (i.e., larger number of trim arms and any additional blocks implemented to enable provision of selectable pre-emphasis levels) connected to terminal 145P (or 145M), larger is the value of the corresponding parasitic capacitance 305P (or 305M).

In an embodiment, resistors of the circuit of FIG. 3 are implemented as N-well resistors. Implementation of the resistors as N-well may be preferred for reasons of cost (compared to other implementation techniques such as polysilicon resistors), but typically results in larger values of parasitic capacitances 305P and 305M.

One undesirable effect of the parasitic capacitances is that the output voltage across terminals 145P and 145M, at least in pre-emphasis intervals, may deviate from a desired pre-emphasis level. Specifically, since the parasitic capacitances need to be charged, output voltage levels in pre-emphasis intervals may not reach the desired final voltage levels (e.g., +Vh and −Vh of FIG. 2) sufficiently quickly.

An example waveform of the output across terminals 145P/145M illustrating the effect of parasitic capacitances 305P and 305M is represented by waveform 145~ shown in dotted lines for the interval t21-t23 of FIG. 2. As may be observed, waveform 145~ does not attain the desired voltage level of +Vh in the pre-emphasis interval t21-t22 (one bit-period), thereby potentially resulting in an incorrect logic-level decision in a receiver connected to receive output 145~. In general, larger the capacitances 305P and 305M, longer the 'settling time' (time taken to reach voltage level +Vh in the example) of waveform 145~.

Similarly, the desired level of pre-emphasis −Vh may not be attained in intervals when a logic zero output is generated. In addition, transistors in CMOS inverters of the circuit of FIG. 3 may also add capacitance, further degrading waveform 145~. For example, capacitor 381 represents the parasitic capacitance due to transistors in inverter 380-N. The other inverters of FIG. 3 may contribute similarly to parasitic capacitances. The effect of such capacitances is to further degrade the shape of waveform 145~.

Typically, the effect of the parasitic capacitances (noted above) on settling times of output 145P/145M is worse (longer settling times) in strong process corners. In a strong process corner, resistance (e.g., 320P) of the resistor in a driver arm may be smaller than in weak process corners, and hence, all or most of the trim arms of the driver arm would be disabled. As a result, the total number of drivers that are operational is small (typically, only the driver arm would be operational), and may not be able to charge the corresponding parasitic capacitances sufficiently fast to enable output 145P/145M to attain the desired pre-emphasis level within (or at the mid-point) of a pre-emphasis interval.

3. Pre-Emphasis Correction

The undesirable effect of parasitic capacitances at terminals 145P/145M, as well as the effect of parasitic capacitances (such as capacitance 381), are mitigated by the addition, in pre-emphasis intervals, of resistors in parallel with resistors of corresponding driver arms. In the circuit of FIG. 3, pre-emphasis correction arms 372P and 372M provide such resistors.

Pre-emphasis correction arm 372P (first correction arm) is shown containing P-type MOS transistor 340P, N-type MOS transistor 350P and resistor 330P (first correction impedance). The gate terminals of transistors 340P and 350P receive respective control signals 341P and 351P. Signals 341P and 351P are generated by logic block 130 (and provided on path 134) based on the 'current' and immediately previous bits of the 'input signal' generated in logic block 130, as described with respect to the table entries of FIG. 6.

Figure 5:
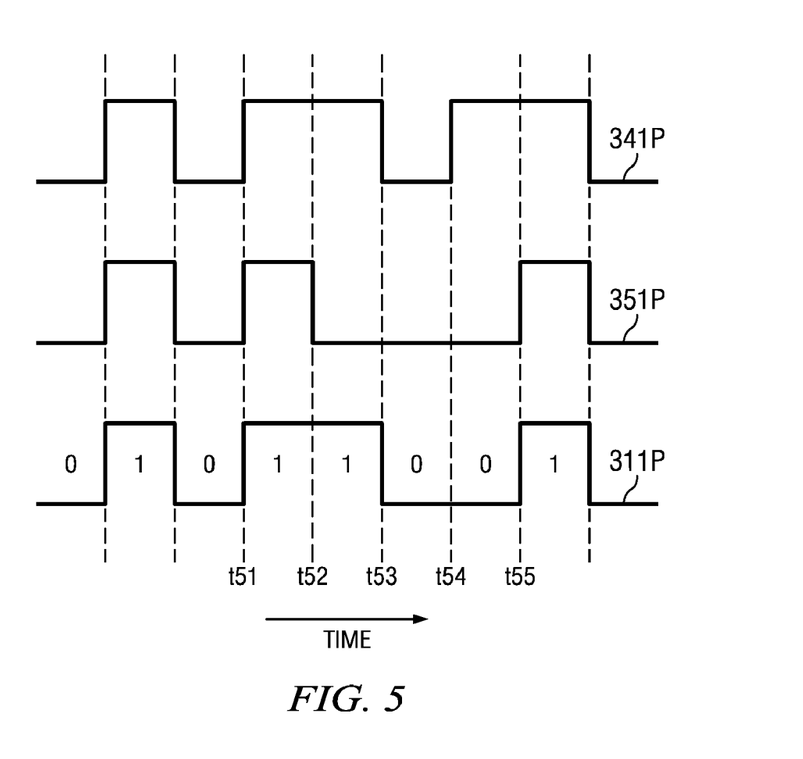
FIG. 5 is a diagram of waveforms illustrating example data values provided as input to a driver arm of a driver, and the corresponding values of control signals provided to a pre-emphasis correction arm corresponding to the driver arm, in an embodiment.

FIG. 5 is a diagram showing example signal values on node 311P, and the corresponding values of signals 341P and 351P. As may be observed from the waveforms shown in FIG. 5, in every pre-emphasis interval, resistor 330P is connected in parallel with resistor 320P. For example, in pre-emphasis interval t51-t52, signal 311P is a logic one and resistor 320P is connected between terminal 145P and ground 399 (via an internal path in inverter 310P). In interval t51-t52, signals 341P and 351P are each a logic high. As a result, transistor 340P is OFF and transistor 350P is ON, and resistor 330P is connected between terminal 145P and ground.

In steady-state intervals, resistor 330P is not connected to either power supply or ground, and therefore floats, i.e., resistor 330P is effectively decoupled from node 145P. For example, in steady-state interval t52-t53, signal 311P is a logic one and resistor 320P is connected between terminal 145P and ground 399. In interval t52-t53, signal 341P is a logic high, while signal 351P is a logic low. As a result, both of transistors 340P and 350P are OFF, and resistor 330 is in a floating condition. Pre-emphasis correction arm 372P is operated in manner similar to that described above in each of the other bit-intervals shown in FIG. 5.

Pre-emphasis correction arm 372M (second correction arm) is shown containing P-type MOS transistor 340M, N-type MOS transistor 350M and resistor 330M (second correction impedance). The gate terminals of transistors 340M and 350M receive respective control signals 341M and 351M. Signals 341M and 351M are generated by logic block 130 (and provided on path 134) based on the 'current' and immediately previous bits of the 'input signal' generated in logic block 130, as described with respect to FIG. 6. Pre-emphasis correction arm 372M is operated to connect resistor 330M in parallel with resistor 320M in pre-emphasis intervals. In steady-state intervals, both of transistors 340M and 350M are OFF, and resistor 330M is in a floating condition.

Figure 6:
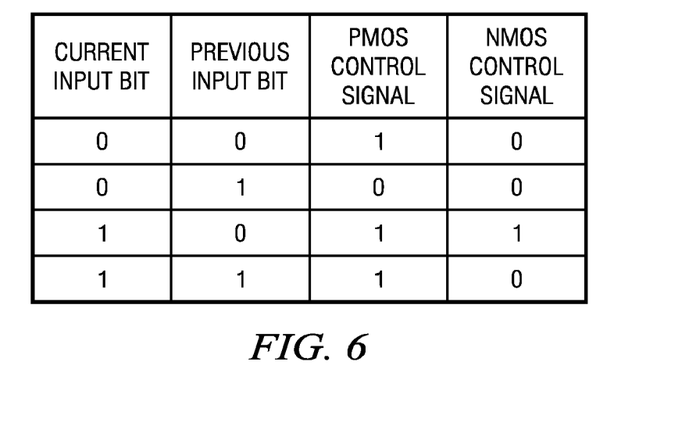
FIG. 6 is a diagram showing a table with entries specifying input values provided to a driver arm of a driver, as well as the corresponding control signals provided to a pre-emphasis correction arm corresponding to the driver arm, in an embodiment.

FIG. 6 shows a table with entries specifying the values of the controls signals provided to the P-type MOS transistor and the N-type MOS-transistor of a pre-emphasis correction arm (e.g., arm 372P) corresponding to each of the four possible combinations of bit values of a 'current bit' and an immediately 'previous bit' provided as inputs to a driver arm (e.g., arm 371P). Entries under column 'Current Input Bit' specify the value of the input bit to a driver arm, control signals corresponding to which are generated by logic block 130 on path 134. Entries under column 'Previous input Bit' specify the bit value of the immediately previous input bit to the driver arm. Entries under column 'PMOS Control Signal' specify the binary values of the control signal applied at the gate terminal of the P-type MOS transistor in a pre-emphasis correction arm corresponding to the driver arm. Entries under column 'NMOS Control Signal' specify the binary values of the control signal applied at the gate terminal of the N-type MOS transistor in a pre-emphasis correction arm corresponding to the driver arm.

The connection of resistors of pre-emphasis correction arms in parallel with corresponding resistors of driver arms in driver 140, increases the voltage provided across output terminals 145P/145M, thereby compensating for the effects otherwise of parasitic capacitances noted above, in pre-emphasis intervals. In steady state intervals, resistors of pre-emphasis correction arms do not affect the voltage across output terminals 145P/145M. In general, the adverse effects of parasitic capacitances may not be of concern.

In an embodiment, each of blocks 360P and 360M is also implemented with corresponding trim blocks and pre-emphasis correction arms, although not shown in FIG. 3. Further, any additional blocks implemented to provide selectable pre-emphasis levels (as noted above) also contain trim blocks and pre-emphasis correction arms. The specific value of resistance of a resistor in a pre-emphasis correction arm may be implemented to offset the effect of the corresponding parasitic capacitance, or the shortfall in the value of the output voltage attained (for example, as measured at the center of a bit-interval) in a pre-emphasis interval. In an embodiment, when used in conjunction with the circuit of FIG. 4A, resistances 330P and 330M of respective pre-emphasis correction arms 372P and 372M are each implemented with a value of 600 ohms.

In an embodiment, pre-emphasis correction arms such as 372P and 372M are operated only when driver 140 is required to handle high-speed data transfer rates (such as of the order of 5 gigabits per second). When driver 140 is operated to handle lower data transfer rates (e.g., of the order of 2.5 gigabits per second), pre-emphasis correction arms such as 372P and 372M are disabled.

In an embodiment, resistors (e.g., 330P) of pre-emphasis correction arms are not trimmed, i.e., the pre-emphasis correction arms are not implemented with corresponding trim arms. Therefore, the inclusion of the pre-emphasis correction arms does not substantially add to the parasitic capacitances noted above. As noted above, the effect of the parasitic capacitances on settling times of output 145P/145M is worse in strong process corners than in weaker process corners. However, the resistor of a pre-emphasis correction arm 'tracks' the resistance deviation (due to process variations) of the resistor of a corresponding driver arm. As an example, assuming resistor 320P (and IC 100) is obtained from a strong process corner, resistance 320P designed for a value of seventy five ohms may actually have a value of fifty ohms. However, resistance 330P is also correspondingly smaller, and the parallel combination of resistances 320P and 330P is small enough (in conjunction with other resistor pair combinations, as noted above) to enable output 145P/145M to be provided with a sufficiently large value in pre-emphasis intervals. Hence, the technique described above has a tight PVT-spread, i.e., small variations across process, voltage and temperature (PVT).

The use of a pre-emphasis correction arm to add a resistor in parallel with the resistor of corresponding driver arm has very little impact on the return loss at high frequencies (high data transfer rates). As is well-known in the relevant arts, return loss is a measure of mismatch between the output impedance of driver 140 and the characteristic impedance of transmission line 150. By comparison, the return loss may be higher at lower frequencies. However, a higher return loss may be allowable or acceptable at lower frequencies, as for example according to the PCIe specification.

A high-speed voltage-mode driver supporting pre-emphasis implemented as described above provides easy programmability (resistance value provided by a pre-emphasis arm can be changed or programmed easily), easy portability (the technique can be easily re-designed for different output voltage levels, and different technology types), and minimal additional area for implementation of the pre-emphasis correction arms (pre-emphasis correction arms do not require trimming). The pre-emphasis correction arms are operated using the same power supply as the driver arms, and hence no additional power supply is required.

Figure 7:
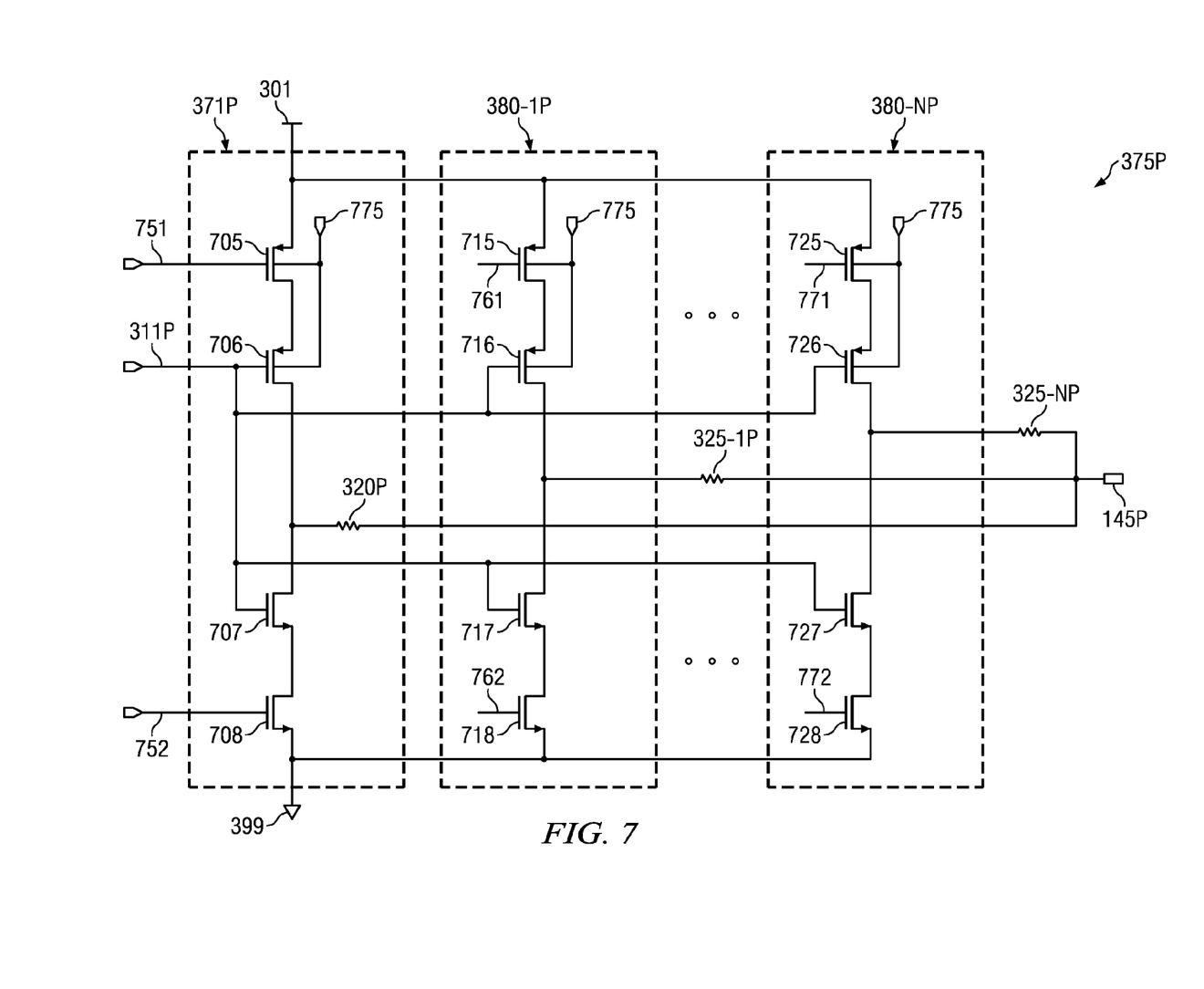
FIG. 7 is a circuit diagram illustrating the details of a portion of a driver, in an embodiment.

FIG. 7 is a circuit diagram illustrating the implementation details of block 375P of FIG. 3. Transistors 705, 706, 715, 716, 725 and 726 are P-type MOS transistors, and transistors 707, 708, 717, 718, 727 and 728 are N-type MOS transistors. Transistors 705 and 708 receive respective enable signals 751 and 752, which together represent enable signal ENP of FIG. 3. Transistors 715 and 718 receive respective enable signals 761 and 762, which together represent enable signal EN-1P of FIG. 3. Transistors 725 and 728 receive respective enable signals 771 and 772, which together represent enable signal EN-NP of FIG. 3. When driver arm 371P is to be enabled, signal 751 and 752 are respectively at logic zero and logic one, and are respectively at logic one and logic zero otherwise. Enable signals 761/762 and 771/772 are generated in a similar fashion. Blocks 375M, 360P and 360M of FIG. 3 may be implemented similar to the circuit of FIG. 7. Terminal 775 is connected to a voltage source (not shown) to maintain the bulk terminal of the P-type transistors of FIG. 7 at a desired voltage level. Typically, terminal 775 is connected to power supply terminal 301.

In the illustrations of FIGS. 1, 3, 4A and 7, though terminals/nodes are shown with direct connections to various other terminals, it should be appreciated that additional components (as suited for the specific environment) may also be present in the path, and accordingly the connections may be viewed as being electrically coupled to the same connected terminals.

The circuit topologies of FIGS. 3 and 7 are merely representative. Various modifications, as suited for the specific environment, without departing from the scope and spirit of several aspects of the present disclosure, will be apparent to one skilled in the relevant arts by reading the disclosure provided herein. It should be appreciated that the specific type of transistors (such as NMOS, PMOS, etc.) noted above are merely by way of illustration. However, alternative embodiments using different configurations and transistors will be apparent to one skilled in the relevant arts by reading the disclosure provided herein. For example, the PMOS transistors may be replaced with NMOS transistors, while also interchanging the connections to power and ground terminals. Accordingly, in the instant application, power and ground terminals are referred to as constant reference potentials, the source (emitter) and drain (collector) terminals of transistors (through which a current path is provided when turned on and an open path is provided when turned off) are termed as current terminals, and the gate (base) terminal is termed as a control terminal.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A driver circuit comprising:
   a first driver arm including first transistor circuitry and a first resistance, the first transistor circuitry being connected between a pair of constant reference potentials and having control terminals connected to a first control input, the first resistance being connected between the first transistor circuitry and a first output, in a pre-emphasis mode and in a steady state mode the first transistor circuitry coupling the first resistance between the output terminal and one of the constant reference potentials;
   a second driver arm including second transistor circuitry and a second resistance, the second transistor circuitry being connected between the constant reference potentials and having control terminals connected to a second control input separate from the first control input, the second resistance being connected between the second transistor circuitry and the first output, in the pre-emphasis mode and in the steady state mode the second transistor circuitry coupling the second resistance between the output terminal and one of the constant reference potentials; and
   a first correction arm including third transistor circuitry and a third resistance, the third transistor circuitry being connected between the constant reference potentials and having control terminals connected to a first correction input separate from the first and second control inputs, the third resistance being connected between the third transistor circuitry and the first output, in the pre-emphasis mode the third transistor circuitry coupling the third resistance between the first output and one of the constant reference potentials, and in the steady state mode the second transistor circuitry de-coupling the third resistance from the constant reference potentials.

2. The driver circuit of claim 1 including a transmission line connected to the output and in which an output voltage generated at the output is greater in the pre-emphasis mode than in the steady-state mode for a same value of a digital signal.

3. The driver circuit of claim 1 including a third driver arm having an inverted control input, a fourth resistance and a second output coupled to the first output, and a second correction arm having a second correction input separate from the inverted control input and a fifth resistance connected to the second output, in the pre-emphasis mode and in the steady state mode the third driver arm coupling the fourth resistance between the second output and one of the constant reference potentials, in the pre-emphasis mode the second correction arm coupling the fifth resistance between the second output and one of the constant reference potentials, and in the steady state mode the second correction arm de-coupling the fifth resistance from the constant reference potentials.

4. The driver circuit of claim 1 in which the first driver arm includes a trim arm having trim transistor circuitry and a trim resistance, the trim circuitry being connected between the reference potentials, having enable inputs, and having control inputs connected to the first control input, and the trim resistance being connected between the trim transistor circuitry and the first output.

* * * * *